(12) United States Patent
Mundell et al.

(10) Patent No.: US 10,349,565 B2
(45) Date of Patent: Jul. 9, 2019

(54) ELECTRONIC ASSEMBLY ARCHITECTURES USING MULTI-CABLE ASSEMBLIES

(71) Applicant: Apple Inc., Cupertino, CA (US)

(72) Inventors: Kurtis J. Mundell, San Francisco, CA (US); Sina Bigdeli, Saratoga, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/423,466

(22) Filed: Feb. 2, 2017

(65) Prior Publication Data

US 2018/0070484 A1    Mar. 8, 2018

Related U.S. Application Data

(60) Provisional application No. 62/384,056, filed on Sep. 6, 2016.

(51) Int. Cl.

| H05K 1/02 | (2006.01) |
|---|---|
| H05K 9/00 | (2006.01) |
| H05K 1/18 | (2006.01) |
| H05K 3/30 | (2006.01) |
| H05K 3/40 | (2006.01) |
| G06F 1/16 | (2006.01) |

(52) U.S. Cl.
CPC ......... *H05K 9/0024* (2013.01); *G06F 1/1613* (2013.01); *H05K 1/0237* (2013.01); *H05K 1/0265* (2013.01); *H05K 1/181* (2013.01); *H05K 3/303* (2013.01); *H05K 3/4007* (2013.01); *H05K 2201/10098* (2013.01)

(58) Field of Classification Search
CPC ............................................ H01L 2924/01079
USPC ........................................................ 174/261
See application file for complete search history.

(56) References Cited

U.S. PATENT DOCUMENTS

| 7,148,428 | B2 | 12/2006 | Meier et al. | |
|---|---|---|---|---|
| 7,952,890 | B2* | 5/2011 | Myers | H05K 9/0032 174/350 |
| 9,325,121 | B2 | 4/2016 | Gundel et al. | |
| 9,431,190 | B2* | 8/2016 | McClure | G06F 1/1613 |
| 2007/0054510 | A1 | 3/2007 | Price | |
| 2010/0195291 | A1* | 8/2010 | Kimura | H05K 1/0218 361/748 |
| 2010/0319981 | A1* | 12/2010 | Kapusta | H05K 9/0024 174/350 |

(Continued)

*Primary Examiner* — Stanley Tso
(74) *Attorney, Agent, or Firm* — Dickinson Wright RLLP

(57) ABSTRACT

An electronic assembly having a printed circuit board (PCB) formed of a substrate of electrically isolating material that electrically isolates conductive traces carried therein and an electrical contact electrically coupled to an electrical trace and including, an electrical component that uses a high current/low loss signal, the electrical component being mounted at the substrate and electrically coupled to the electrical contact, a flex assembly having a housing formed of electrically isolating material, the housing carrying lines in a stacked arrangement each of which is capable of providing a high current/low loss path for carrying the high current/low loss signal, the flex assembly having a terminal having contacts arranged in a low-noise pattern where a contact is electrically connected to a corresponding transmission line and capable of forming an electrical connection between the transmission line and at least one electrical trace.

14 Claims, 7 Drawing Sheets

(56) References Cited

U.S. PATENT DOCUMENTS

| | | | |
|---|---|---|---|
| 2011/0109407 A1* | 5/2011 | Horie | H01P 3/006 333/238 |
| 2012/0044653 A1* | 2/2012 | Morris | H05K 1/0218 361/728 |
| 2015/0194387 A1* | 7/2015 | Yazar | H01L 23/552 174/350 |
| 2016/0018442 A1 | 1/2016 | Sinsheimer et al. | |
| 2016/0268716 A1 | 9/2016 | Conger et al. | |
| 2016/0341790 A1 | 11/2016 | Thompson et al. | |

\* cited by examiner

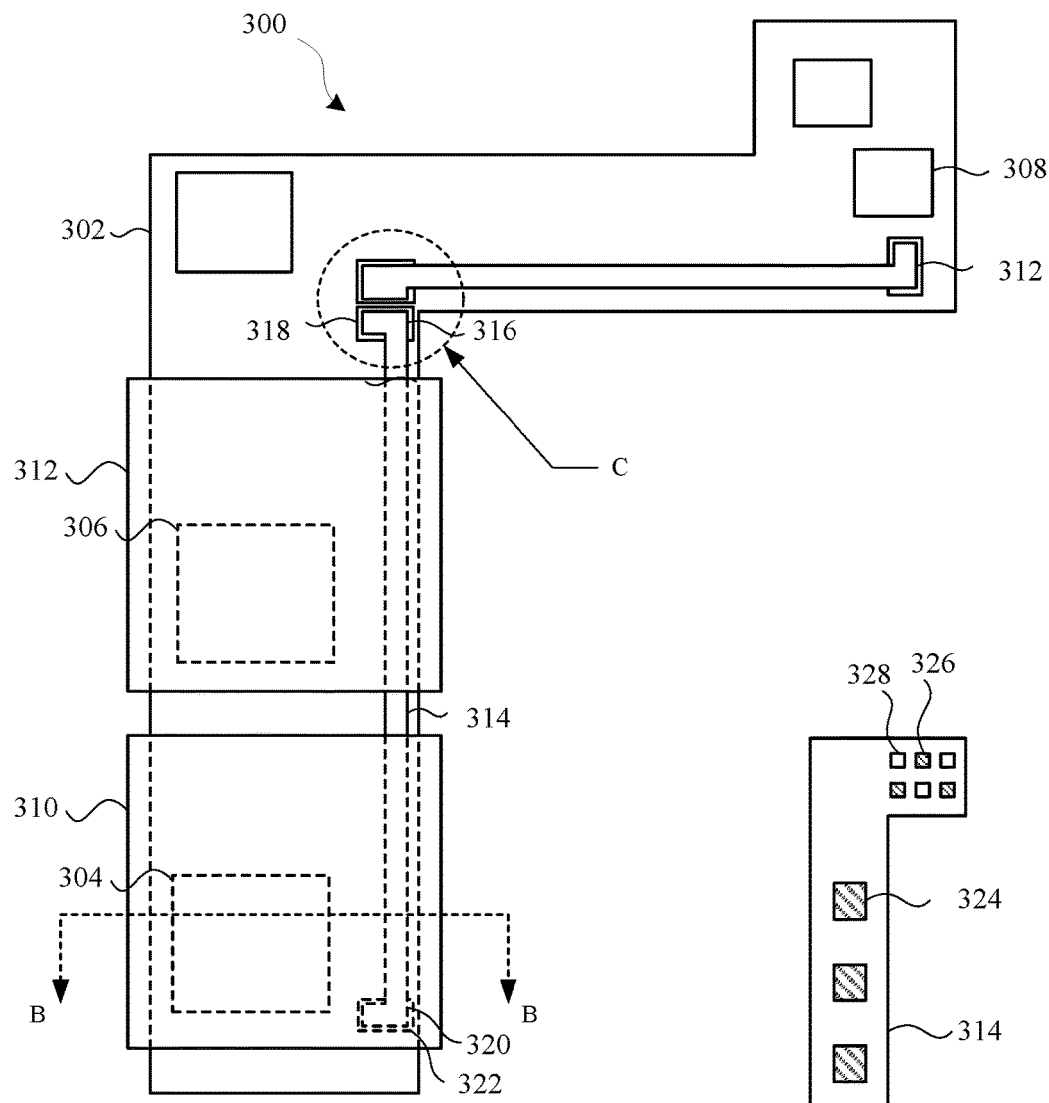
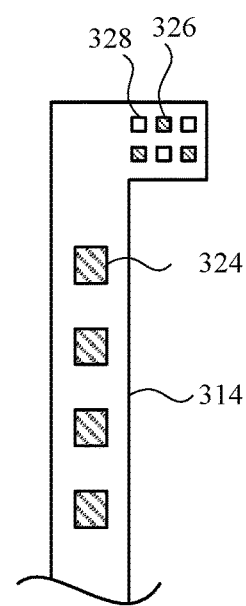
FIG. 3A
FIG. 3B

ELECTRONIC ASSEMBLY ARCHITECTURES USING MULTI-CABLE ASSEMBLIES

CROSS-REFERENCE TO RELATED APPLICATIONS

The present application claims the benefit of U.S. Provisional Application No. 62/384,056, entitled "ELECTRONIC ASSEMBLY ARCHITECTURES USING ON-BOARD FLEX ASSEMBLIES" filed Sep. 6, 2016, the content of which is incorporated herein by reference in its entirety for all purposes.

FIELD

The described embodiments relate generally to printed circuit boards for computing devices. More particularly, the present embodiments relate to printed circuit boards that can carry multiple high power signals using a flex assembly.

BACKGROUND

Computing devices incorporate a variety of electrical components that can each provide different functions. Printed circuit boards (PCB) carry the functional computing circuitry components that generate, sense, receive and processes data utilized by the computing device. High power signals used by various components tend to generate electromagnetic fields that can cause interference with other components on the PCB or in a computing device. Thus, signal transmission along the PCB and in the computing device of high power signals requires special considerations such as shielding components and transmission lines from one another and or spacing components appropriate distances apart. At the same time, computing devices continue to get smaller and smaller and the space consumed by the PCB, components and transmission lines is also getting smaller as a result. Thus, it is desirable to have printed circuits boards that can address both of these considerations.

SUMMARY

Some embodiments include an electronic assembly having a printed circuit board (PCB) formed of a substrate having a surface, the PCB substrate formed of electrically isolating material that electrically isolates conductive traces carried therein, the surface having an electrical contact electrically coupled to an electrical trace. The electronic assembly can include an electrical component that uses a high current/low loss signal for operation, the electrical component being mounted at the surface of the substrate and electrically coupled to the electrical contact. The electronic assembly can include a flex assembly having a housing formed of electrically isolating material, the housing carrying transmission lines in a stacked arrangement each of which is capable of providing a high current/low loss path for carrying the high current/low loss signal, the flex assembly having a terminal having contacts arranged in a low-noise pattern where a contact is electrically connected to a corresponding transmission line and capable of forming an electrical connection between the transmission line and at least one electrical trace. The electronic assembly can include an electromagnetic interface (EMI) shield having EMI shield walls electrically coupled to a conductive trace corresponding to an electrical ground, the EMI shield walls preventing passage of EM energy to/from an EMI shield volume defined by the EMI shield walls, where the electrical component and at least a portion of the flex assembly are positioned within the EMI shield volume.

Some embodiments can include a printed circuit board architecture for a printed circuit board (PCB) formed of an electrically insulating material and having conductive traces interlaid within the electrically insulating material, the PCB having a primary portion and a secondary portion with the secondary portion being displaced from primary portion, the primary portion including an electronic component configured to process signals generated by RF sensitive components and the secondary portion comprising an RF sensitive electronic component configured to receive and/or transmit high power/low loss signals. The printed circuit board architecture can include a flex assembly having an electrically isolating material surrounding multiple signal lines in a stacked arrangement each of which is capable of providing a high current/low loss path for carrying the high current/low loss signal, the flex assembly having signal contacts arranged in an interference isolating pattern at a terminal, each signal contact being electrically connected to a signal line and forming an electrical connection between the signal lines and electrical traces in the PCB. The printed circuit board architecture can include an electromagnetic interface (EMI) shield having walls electrically coupled to a conductive trace at the primary portion of the PCB and corresponding to an electrical ground in the PCB, the walls preventing passage of EM energy to/from an internal portion of the EMI shield, wherein the electrical component and at least a portion of the flex assembly are positioned within the EMI shield volume.

Some embodiments can include a method for assembling a printed circuit board (PCB) having a substrate having a surface, the PCB formed of electrically isolating material that electrically isolates conductive traces carried therein, the surface having an electrical contact electrically coupled to an electrical trace and an electrical component that uses a high current/low loss signal for operation, the electrical component being mounted at the surface of the substrate and electrically coupled to the electrical contact. The method can include locating electrical traces of the PCB configured to receive corresponding contacts of a flex assembly. The method can include, in a pick and place operation, placing the flex assembly on the PCB such that the contacts align with the electrical traces of the PCB, the contacts being arranged in a low-noise pattern and forming connections to signal lines embedded within an electrically insulating material where each of the signal lines provides a high current/low signal loss path suitable for carrying the high current/low loss signal. The method can include electrically connecting the contacts with the electrical traces of the PCB.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

FIG. 3A illustrates a printed circuit board including a flex assembly with an architecture in accordance with the described embodiments.

FIG. 3B illustrates an underside of the flex assembly of FIG. 3A in accordance with the described embodiments.

DETAILED DESCRIPTION

Figure 1:
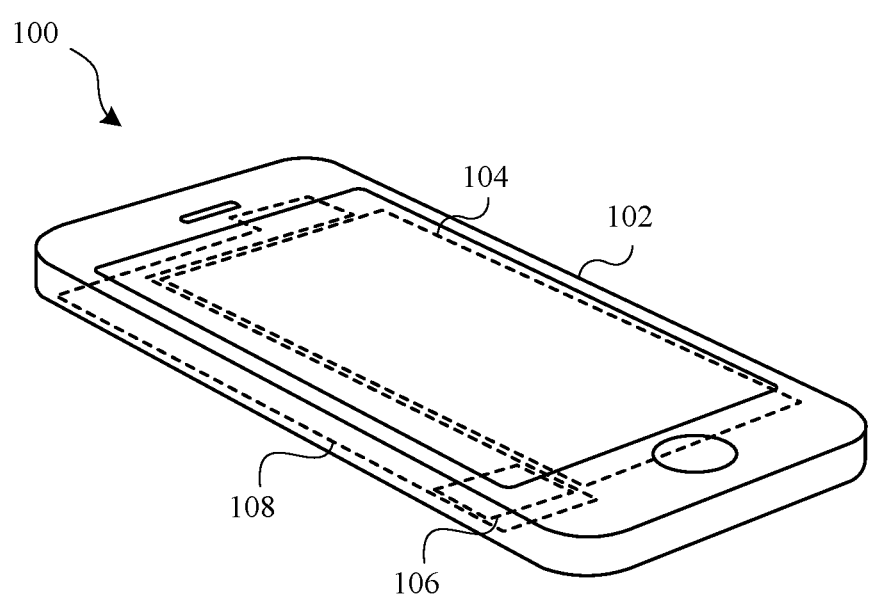
FIG. 1 illustrates an exemplary computing device that can utilize printed circuit boards in accordance with the various disclosed embodiments.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Many computing devices have been designed to be more compact while also increasing functionality of the computing devices. Increasing functionality can require maintaining adequate power generation for the various computing devices. As the computing devices become more compact the spatial layout of internal operational components such as the computing circuitry and the battery, becomes more and more critical. With regard to operational electronic components that require high-power/low loss signals, such as radio antenna components, signal integrity across cables and transmission lines is an important consideration in printed circuit board design because a loss of signal integrity can lead to data loss or dropped transmission of the radio signal. Also, high power signals tend to generate electromagnetic fields that can interfere with nearby signals and/or components, known as electromagnetic interference (EMI) or crosstalk. To prevent this EMI, shielding can be used to shield components form one another. As for the transmitting signals between components within a computing device and/or on a printed circuit board, coaxial cables are often used with one coaxial cable for each signal.

As such, coaxial cables can be used for connecting components such as radio transmitters and receivers with other components arranged on the PCB such as a processor. In a coaxial cable there are inner conductors (the signal transmission line) and outer conductors (the shield) separated by an electrically insulating dielectric material. This results in the generated electromagnetic field existing only in the space between inner and outer conductors of the coaxial cable. Thus, coaxial cable runs can be installed near metal (such as EMI shields) or other components without the power losses that occur in other types of transmission lines. Coaxial cable also provides protection of the signal from external EMI. That said, modern computing devices can support multiple radio signals simultaneously such as for both downloading and uploading over Wi-Fi simultaneously and/or using multiple RF band frequencies for wireless communication. Because of the high power signal and EMI considerations for these high power requirements, the transmission lines are not typically embedded within the PCB, but rather are coupled to the exterior of the PCB and are thus sometimes additionally referred to as on-board cables. Having separate coaxial cables to support each different transmission line for each different signal requires significant physical space on the printed circuit board and within a computing device. Mounting clips that hold the individual coaxial cables to the PCB contribute to the space consumed by the coaxial cables. Also, conventionally coaxial cables have to be routed around the EMI shields covering other electronic components.

Some embodiments of present invention can include a flex assembly that is configured to carry multiple signal transmission lines in an insulating material that isolates the multiple high power/low loss signals from each other. The flex assembly can be coupled to the PCB. Flex assembly can be an on-board flex assembly capable of transmitting multiple high-power/low loss signals while maintaining signal integrity and adequate EMI shielding. The flex assemblies can carry two or more signal lines (or transmission lines). In some embodiments multiple flex assemblies can be used on a single PCB or a flex assembly can be used to connect multiple PCB's. The flex assembly can have first and second ends that have a terminal with signal contacts. The terminal can also have intermixed ground contacts. While referred to as a flex assembly herein, the flex assembly may be referred to as a cable, transmission line or wire, among similar names for signal transmission mechanisms.

Some embodiments of PCB's in accordance with the present invention can have an architecture utilizing the flex assembly. The flex assembly can be used to connect high power signal electronic components coupled to the PCB. High power signal electronic components can at least include, but are not limited to, radio frequency antennae including receivers and transmitters and receivers. The high power signal electronic components can be mechanically and electrically coupled to the PCB. The PCB can have electrical traces arranged and configured to mate with the signal contacts of the terminals of the flex assembly. The flex assembly can be routed along the exterior of the PCB and can be arranged to travel underneath an EMI shield that can cover operational components of the PCB. In some embodiments the flex assembly can be laser cut to a predetermined configuration for easy installation on the PCB. In some embodiments the flex can travel under more than one EMI shields. By routing the flex assembly under the EMI shield, or multiple EMI shields, critical space on the PCB can be saved. This allows either additional components to be added to the PCB or in some embodiments a smaller PCB can used which can provide critical space in the computing device for other components such as a battery. In some embodiment more than one flex assemblies can be used on a PCB to further save space. In some embodiments operation components can be mounted on both a top and bottom side of the PCB.

More specifically, some embodiments can include an electronic assembly having a printed circuit board (PCB)

formed of a substrate having a surface, the PCB substrate formed of electrically isolating material that electrically isolates conductive traces carried therein, the surface having an electrical contact electrically coupled to an electrical trace. The electronic assembly can include an electrical component that uses a high current/low loss signal for operation, the electrical component being mounted at the surface of the substrate and electrically coupled to the electrical contact. The electronic assembly can include a flex assembly having a housing formed of electrically isolating material, the housing carrying transmission lines in a stacked arrangement each of which is capable of providing a high current/low loss path for carrying the high current/low loss signal, the flex assembly having a terminal having contacts arranged in a low-noise pattern where a contact is electrically connected to a corresponding transmission line and capable of forming an electrical connection between the transmission line and at least one electrical trace. The electronic assembly can include an electromagnetic interface (EMI) shield having EMI shield walls electrically coupled to a conductive trace corresponding to an electrical ground, the EMI shield walls preventing passage of EM energy to/from an EMI shield volume defined by the EMI shield walls, where the electrical component and at least a portion of the flex assembly are positioned within the EMI shield volume.

In some embodiments, the flex assembly can include a ground contact at an exterior surface of the housing. In some embodiments, the PCB can include a primary portion and a secondary portion, the secondary portion being displaced from the primary portion. In some embodiments, the electrical component can be a first electrical component and the flex assembly can be a first flex assembly and the primary portion can include the first electrical component and the first flex assembly. In some embodiments, the secondary portion can include a second electrical component and a second flex assembly.

In some embodiments, the second flex assembly electrically couples the second electrical component to an electrical trace located at the first portion of the PCB. In some embodiments, the first electronic component can be a processor and the second electronic component can be a wireless device comprising an RF antenna. In some embodiments, the EMI shield spans a width of the printed circuit board from a first side of the printed circuit board substrate to a second side of the printed circuit board substrate. In some embodiments, the EMI shield can be a first EMI shield and the electronic assembly can further include a second EMI shield arranged to cover at least one additional electrical component and at least a second portion of the flex assembly can be within the second EMI shield.

Some embodiments can include a printed circuit board architecture for a printed circuit board (PCB) formed of an electrically insulating material and having conductive traces interlaid within the electrically insulating material, the PCB having a primary portion and a secondary portion with the secondary portion being displaced from primary portion, the primary portion including an electronic component configured to process signals generated by RF sensitive components and the secondary portion comprising an RF sensitive electronic component configured to receive and/or transmit high power/low loss signals. The printed circuit board architecture can include a flex assembly having an electrically isolating material surrounding multiple signal lines in a stacked arrangement each of which is capable of providing a high current/low loss path for carrying the high current/low loss signal, the flex assembly having signal contacts arranged in an interference isolating pattern at a terminal, each signal contact being electrically connected to a signal line and forming an electrical connection between the signal lines and electrical traces in the PCB. The printed circuit board architecture can include an electromagnetic interface (EMI) shield having walls electrically coupled to a conductive trace at the primary portion of the PCB and corresponding to an electrical ground in the PCB, the walls preventing passage of EM energy to/from an internal portion of the EMI shield, wherein the electrical component and at least a portion of the flex assembly are positioned within the EMI shield volume.

In some embodiments, the flex assembly can further include ground contacts for coupling to an electrical ground provided by the PCB. In some embodiments, the EMI shield spans a width of the printed circuit board from a first side of the printed circuit board to a second side of the printed circuit board. In some embodiments, the connection between the signal line of the flex assembly and the at least one electrical trace in the PCB can be located under the EMI shield. In some embodiments, the flex assembly can be a first flex assembly and the printed circuit board further can include a second flex assembly that electrically connects the primary portion of the PCB to the secondary portion of the PCB. In some embodiments, the RF sensitive electronic component can be electrically coupled to the primary portion by way of the second flex assembly.

Some embodiments can include a method for assembling a printed circuit board (PCB) having a substrate having a surface, the PCB formed of electrically isolating material that electrically isolates conductive traces carried therein, the surface having an electrical contact electrically coupled to an electrical trace and an electrical component that uses a high current/low loss signal for operation, the electrical component being mounted at the surface of the substrate and electrically coupled to the electrical contact. The method can include locating electrical traces of the PCB configured to receive corresponding contacts of a flex assembly. The method can include, in a pick and place operation, placing the flex assembly on the PCB such that the contacts align with the electrical traces of the PCB, the contacts being arranged in a low-noise pattern and forming connections to signal lines embedded within an electrically insulating material where each of the signal lines provides a high current/low signal loss path suitable for carrying the high current/low loss signal. The method can include electrically connecting the contacts with the electrical traces of the PCB.

In some embodiments, the electrical traces can be first electrical traces located in a first portion of the PCB and the method can further include locating second electrical traces located in a second portion of the PCB, in a pick and place operation, placing a second flex assembly on the PCB, and electrically connecting the contacts of the second flex assembly with the second electrical traces to electrically connect the first portion and second portion of the PCB. Some embodiments can include electrically connecting an electromagnetic interface (EMI) shield to the PCB, the EMI shield including EMI shield walls electrically coupleable to a conductive trace of the PCB corresponding to an electrical ground, the EMI shield walls preventing passage of EM energy to/from an EMI shield volume defined by the EMI shield walls, and where the electrical component and at least a portion of the flex assembly are within the EMI shield volume. In some embodiments, the electronic component can be a processor and the RF sensitive component can be an RF antennae and/or receiver. In some embodiments, the EMI shield spans a width of the printed circuit board and is edge connected to the PCB at an electrical trace of the PCB.

These and other embodiments are discussed below with reference to FIGS. 1-6; however, those skilled in the art will readily appreciate that the detailed description given herein with respect to these figures is for explanatory purposes only and should not be construed as limiting.

FIG. 1 illustrates a perspective view of one type of computing device 100 that can include a PCB having a flex assembly in accordance with the described embodiments of the present invention. Exemplary computing devices can include smartphones, cellphone, tablets, laptops, desktop computers, wearables and any other device that utilizes a PCB and high power/low loss signals. The computing device 100 may include a housing 102 made a material suitable for transmitting radio frequency signals. The housing 102 may alternatively or in addition include features or antenna windows for the transmission of radio frequencies. The computing device can be powered by one or more batteries 104 carried within the housing 102 of the computing device 100. One or more operational components 106 can be mounted to a printed circuit board 108 which can also be carried within the housing 102. The printed circuit board can sometimes be referred to as the main logic board. The PCB can carry operational electronic components such as antennae's, cables, traces, sensors, processors and controllers, just to name a few, for providing for the operation of the computing device 100.

Figure 2A:
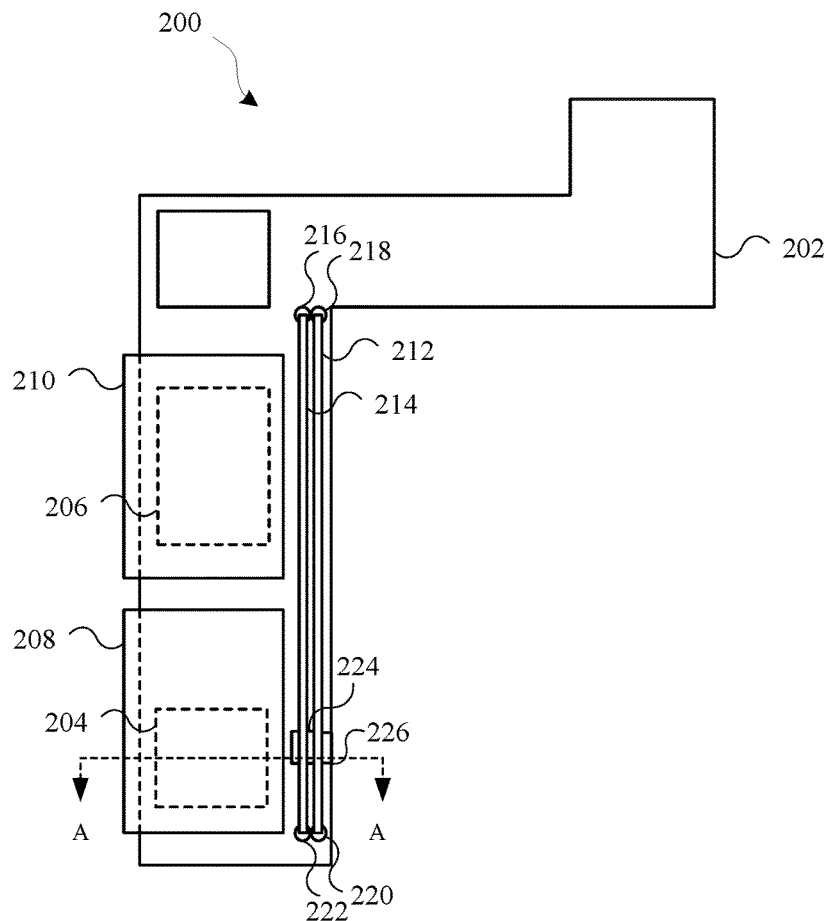
FIG. 2A illustrates a conventional printed circuit board with multiple separate high-power coaxial cables routed on the printed circuit board.

FIG. 2A illustrates a conventional printed circuit board architecture using multiple on-board coaxial cables as transmission lines for high power signals. The printed circuit board 200 can include printed circuit board substrate 202. Substrate 202 can include electrical traces (not shown) embedded and routed within PCB substrate 202. The electrical traces can be exposed at various portions of the PCB substrate 202 for electrically connecting components, cables, shields or any number of other features that require a ground or electrical connection. One or more operation components can be mounted to the printed circuit board substrate 202 and electrically coupled to the electrical traces. As illustrated a first operation component 204 and second operational component 206 can be mounted to the printed circuit board substrate 202. The operational component can be both electrically and mechanically coupled to the printed circuit board substrate 202 using known methods including soldering. The operational components can include, but are not limited to, sensors, processors, amplifiers, antennae, controllers and so on. Some operational components generate or are affected by electromagnetic interference. In the case where the component generates as electromagnetic field, it is important to shield other components and even signals from this electromagnetic field to prevent interference or cross talk. EMI shields connected to ground traces can be used to surround the component to prevent the escape of the electromagnetic field from the EMI shield. The EMI shield can also protect the component from other components or signals that generate electromagnetic fields. A first EMI shield 208 and second EMI shield are shown covering first component 204 and second component 210 respectively. Notably, the EMI shields are connected to mid-point of PCB substrate 202.

A first coaxial cable 212 and a separated second coaxial cable 214 can be mounted to PCB substrate 202 by way of connectors 216 and 218, 220 and 222, as shown. The first coaxial cable 212 can be held to a particular path on the PCB substrate 202 by a clip 224. In the same way the second coaxial cable 214 can be held to a particular path on the PCB substrate 202 by a clip 226. The first coaxial cable 212 and second coaxial cable 214 each carry its own signal that is isolated from the signal of the other coaxial cable to prevent interference or cross talk. This coaxial cable is carried on the printed circuit board substrate 202, thus being referred to as an "on-board" cable, because it is used to transmit high power signals that require minimal losses through resistance, impedance or interference, among other factors, to maintain signal integrity. As such, the coaxial cable is arranged outside of the first EMI shield 208 and second EMI shield. Spacing is necessarily required between the EMI shielding and each coaxial cable to ensure the signal integrity and prevent shorting of components, in addition to the physical stack up of the coaxial cables and the EMI shield.

FIG. 2A illustrates a cross section view of PCB 200 where operational component 204 can be seen mounted to PCB substrate 202 and surrounded by EMI shield 208. First coaxial cable 212 can be seen carried by slip 224 outside EMI shield 208 and second coaxial cable 214 can be seen carried by clip 226 arranged next to first coaxial cable 212. The necessary spacing between the components, EMI shield, and coaxial cable can be seen here.

FIG. 3A shows a printed circuit board 300 in accordance with the described embodiments herein and illustrates an architecture that provides significant space savings on the PCB, such that an over all width of the PCB can be reduced, or additional operational components can be mounted to the PCB substrate. PCB 300 can include PCB substrate 302 having at least a first operational component 304. PCB can also include numerous additional operational components including a second operational component 306 and an RF sensitive component 308. First operational component 304 and second operational component 306 are located on a primary portion of the PCB and the RF sensitive component 308 is shown as located on a secondary portion of the PCB substrate 202, which is displaced from the primary portion. A First EMI shield 310 is mounted to the PCB substrate 302 and can cover first operational component 304. In addition, a second EMI shield may 314 cover the second operational component 306. While each EMI shield is shown as only covering one component here, the EMI shield can cover multiple components in some embodiments.

A flex assembly 314 can be coupled to PCB substrate 302. Flex assembly 314 can have a first and second ends having a first terminal 316 and second terminal 320, respectively. The first terminal 316 can be coupled to a first landing pad 318. The connection between first terminal 316 and first landing pad 320 can provide both a mechanical and electrical connection with PCB substrate 302. The configuration of signal and ground contacts making up the first terminal 316, which is mirrored in first landing pad 320, can be seen in FIG. 3B, which shows an under side of flex assembly 314. As shown, a signal contact 328 can be spaced apart and next to a ground contact 326 in a pattern the isolates the signal contact 328 from other signal contacts. The arrangement of signal contacts and ground contacts for the terminal for the flex assembly 314 is discussed and illustrated in greater detail below with respect to FIG. 4.

Returning to FIG. 3A, a second end of flex 314 can have a second terminal 320 and be electrically and mechanically connected to a second landing pad 322 in a similar fashion as the connection of the first terminal 316 and first landing pad 318. Flex assembly 314 can also be electrically connected to PCB substrate 302 using ground pads 324 arranged in the underside of flex assembly 314 as seen in FIG. 3B. These connections can provide structural connection points as well as ground paths for flex assembly 314.

First terminal 314 can be connected to the PCB substrate 302 either under an EMI shield or it can be arranged external to an EMI shield on PCB substrate 302. As shown here, first landing pad 318 is arranged under first EMI shield 310. Flex assembly 314 can travel through a wall of first EMI shield 310 exit the first EMI shield 310. Flex assembly 314 can also enter, travel under, and exit second EMI shield 312. Flex assembly 314 can terminate at second terminal 316 and landing pad 318, which as shown here, is not under any EMI shield. The ability to connect flex 314 to the PCB substrate 302 under and EMI shield and for at least portions of the flex 314 to be routed beneath the EMI shield provides significant space savings on the PCB substrate 302, as illustrated further in FIG. 3C.

Figure 2B:
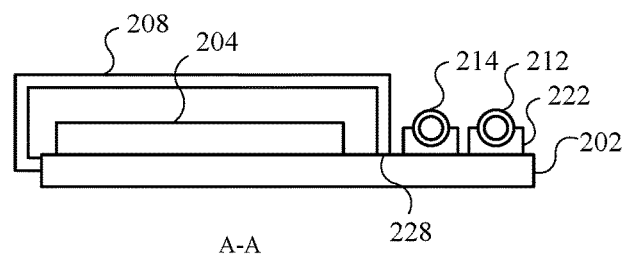
FIG. 2B illustrates a cross section view of the convention printed circuit board of FIG. 2A taken along the cross section line A-A.
Figure 3C:
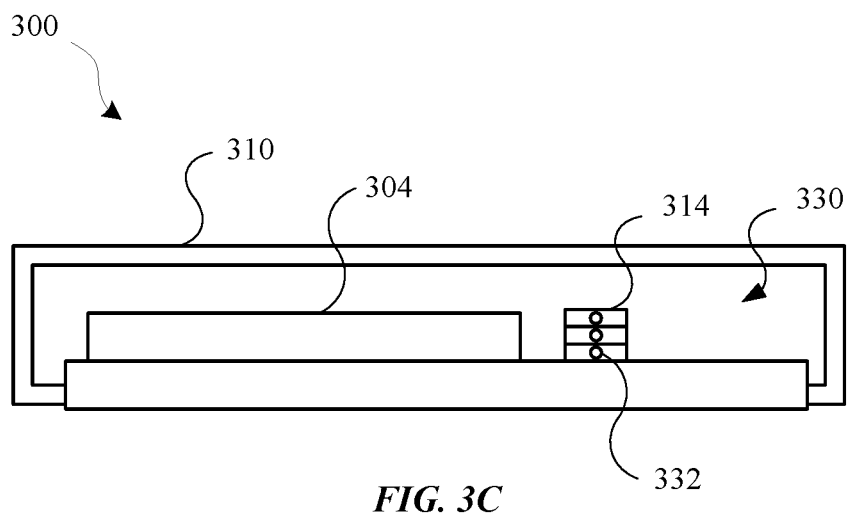
FIG. 3C illustrate a cross section the printed circuit board of FIG. 3A taken along the cross section line B-B.
Figure 3D:
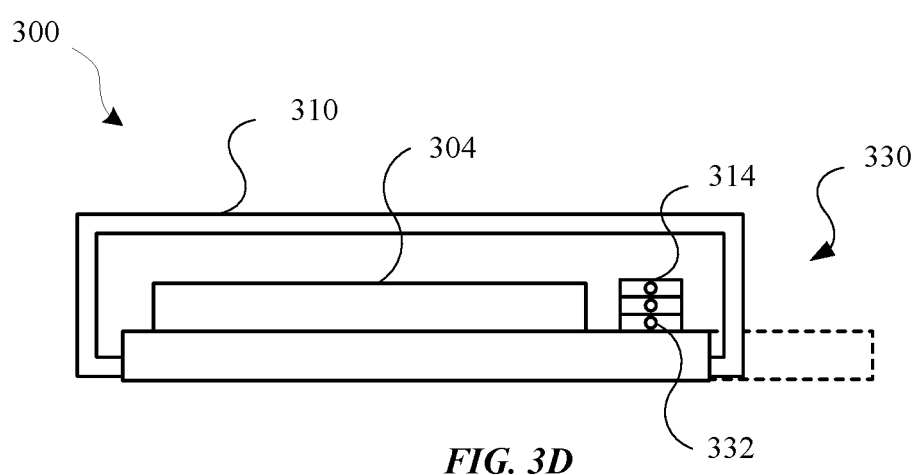
FIG. 3D illustrates an alternative exemplary cross section of FIG. 3A of a printed circuit board similar to the one shown in FIG. 3A, but where the printed circuit board has a smaller width.

FIG. 3C illustrates a cross-section view of PCB 300 taken along line B-B of FIG. 3A. First operation component 304 can be seen mounted to PCB substrate 302 and first EMI shield 310 is arranged over first operation component 304. First EMI shield 310 is also arranged so that it covers flex assembly 314. Flex assembly 314 can include multiple signal lines 332 housed and embedded in an electrically isolation material of flex assembly. Signal lines 332 are configured for transmitting high power/low loss signals through flex assembly 314. Flex assembly 314 can have dimensions of a height and width similar to the height and width of a coaxial cable of the convention PCB 200. Thus, one significant factor in saving space on PCB 300 is the ability to route multiple signal lines 332 in a single flex assembly. That said, an additional factor in providing space savings can be seen in that the first EMI shield 310 can span the width of PCB substrate 302 and be connected to the edge of PCB substrate 202 where the first EMI shield 310 can be soldered to PCB substrate 302. In the conventional PCB 200, the EMI shield connection is on the top of PCB substrate 302 (as seen in FIG. 2B). This connection requires its own space and the first coaxial cable 214 must be appropriately spaced from the connection. In PCB 300, as seen in FIG. 3C the spacing requirements for the EMI shield connection and the cable spacing can be eliminated since the connection can be on the edge of PCB substrate 302. This can leave a saved space region 330 where additional operation components could be mounted as shown in FIG. 3C, or the entire width of PCB substrate 302 can be reduced, as shown in FIG. 3D. Reduction of the width, and size generally, of PCB substrate 302 allows for additional features to be included in the computing device or for increasing the size of other components of computing device, such as the battery.

Figure 4:
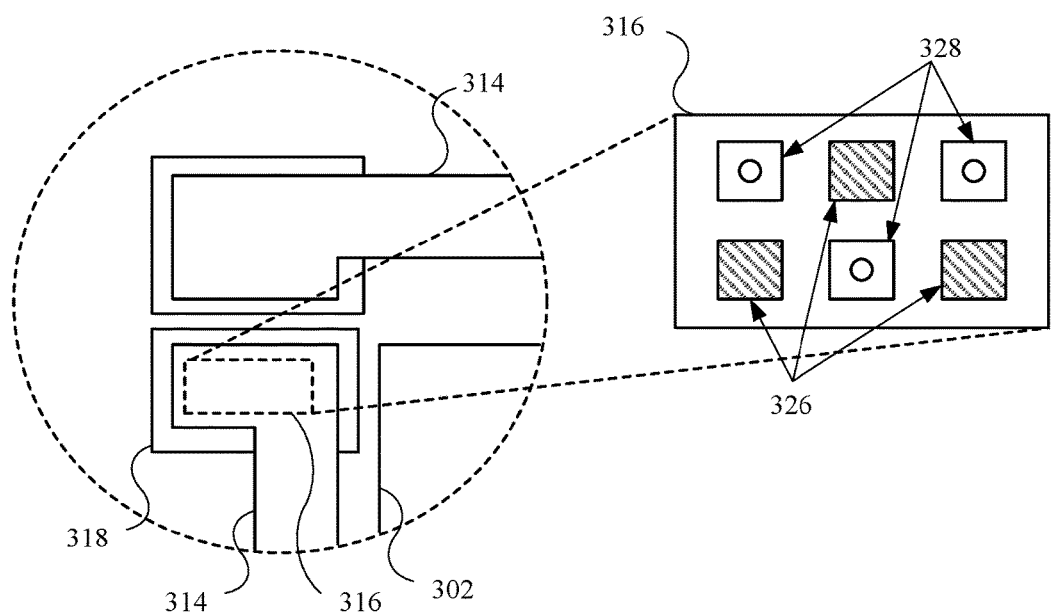
FIG. 4 illustrates a close up view of a contacts of a terminal of the flex assembly of FIG. 3A in accordance with the described embodiments.

FIG. 4 illustrates a close up view of the underside of terminal 316 illustrating a configuration of signal contacts and ground contacts of the terminal of a flex assembly in accordance with some embodiments. As can be seen, three signal contacts 328 can be seen arranged in a matrix, spaced apart laterally and offset from three ground contacts 326. While a matrix of three signal contacts and three ground contacts is shown here, various other configurations are possible so long as the signal contacts are isolated from one another. Here the ground contacts 326 isolate each of the signal contacts 328 from one another. This prevents EMI between signal contacts. In some embodiments where less than three or greater than three signal lines are embedded in the flex assembly, different signal and ground contact patterns can be utilized.

Figure 5:
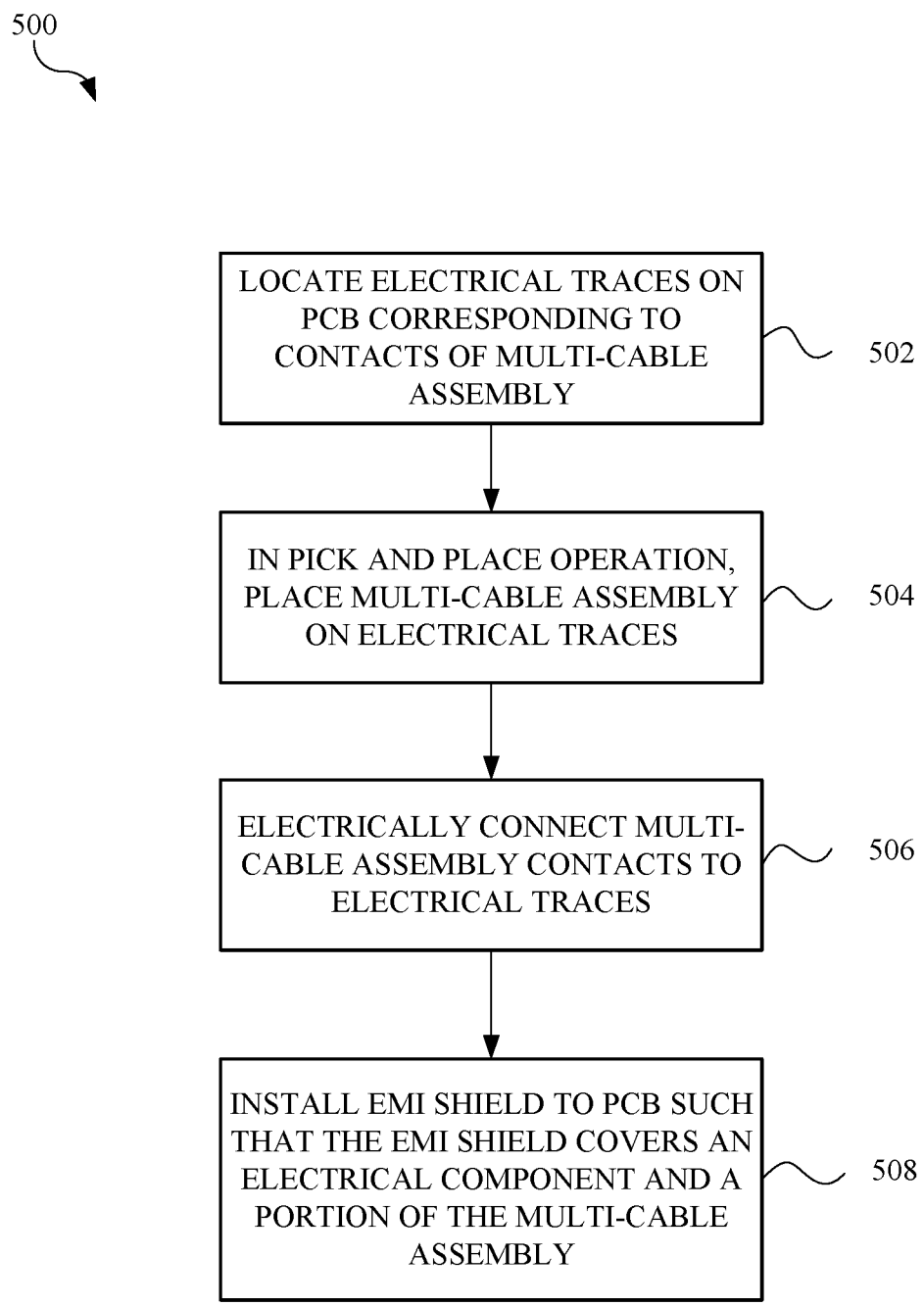
FIG. 5 illustrates a method for assembling printed circuit boards in accordance with the describe embodiments.

FIG. 5 illustrates an embodiment of a method 500 for assembling a printed circuit board having an architecture in accordance with disclosed embodiments. The method 500 can include a step 502 of locating electrical traces of the PCB configured to receive corresponding contacts of a flex assembly. In a pick and place operation in a step 504, the flex assembly can be placed on the PCB such that the contacts align with the electrical traces of the PCB, the contacts being arranged in a low-noise pattern and forming connections to the signal lines embedded within an electrically insulating material where each of the signal lines provides a high current/low signal loss path suitable for carrying the high current/low loss signal. In a step 506, the contacts can be electrically connected with the electrical traces of the PCB. This electrical connecting can include soldering. In an optional step 508 EMI shield can be installed and electrically coupled to the PCB such that the EMI shield covers an electrical component and a portion of the flex assembly.

Figure 6:
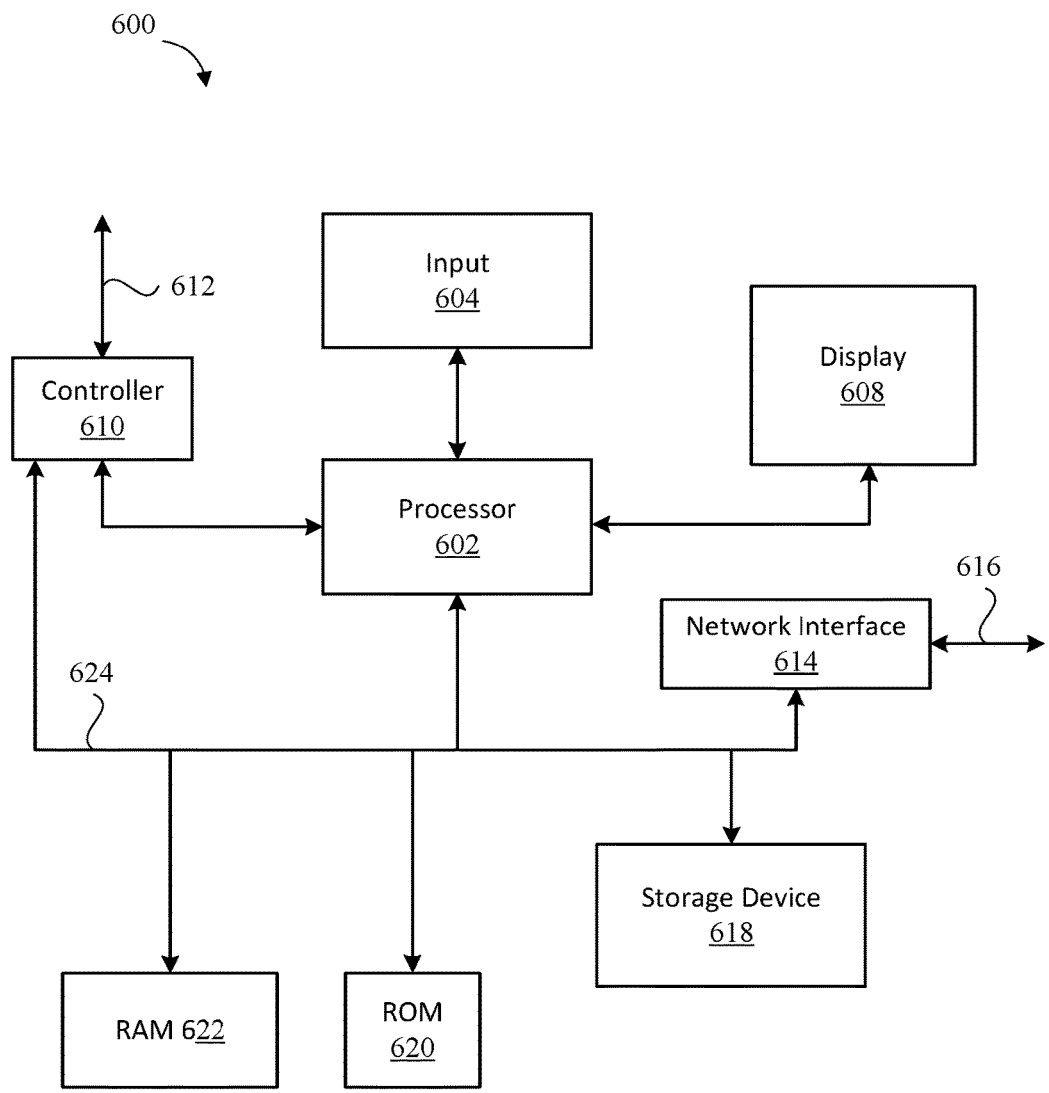
FIG. 6 illustrates an embodiment of a computing system of a computing device that can utilize printed circuit boards as described in various embodiments.

FIG. 6 is a block diagram of a computing device 600 that can use the electronic assembly and PCB described in the disclosed embodiments. It will be appreciated that the components, devices or elements illustrated in and described with respect to FIG. 6 may not be mandatory and thus some may be omitted in certain embodiments. The computing device 600 can include a processor 602 that represents a microprocessor, a coprocessor, circuitry and/or a controller for controlling the overall operation of the computing device 600. Although illustrated as a single processor, it can be appreciated that the processor 602 can include a plurality of processors. The plurality of processors can be in operative communication with each other and can be collectively configured to perform one or more functionalities of the computing device 600 as described herein. In some embodiments, the processor 602 can be configured to execute instructions that can be stored at the computing device 600 and/or that can be otherwise accessible to the processor 602. As such, whether configured by hardware or by a combination of hardware and software, the processor 602 can be capable of performing operations and actions in accordance with embodiments described herein.

The computing device 600 can also include a user input device 604 that allows a user of the computing device 600 to interact with the computing device 600. For example, the user input device 604 can take a variety of forms, such as a button, keypad, dial, touch screen, audio input interface, visual/image capture input interface, input in the form of sensor data, etc. Still further, the computing device 600 can include a display 608 (screen display) that can be controlled by the processor 602 to display information to a user. A controller 810 can be used to interface with and control different equipment through an equipment control bus 812. The computing device 600 can also include a network/bus interface 814 that couples to a data link 816. The data link 816 can allow the computing device 600 to couple to a host computer or to accessory devices. The data link 816 can be provided over a wired connection or a wireless connection. In the case of a wireless connection, network/bus interface 814 can include a wireless transceiver.

The computing device 600 can also include a storage device 818, and a storage management module that manages one or more partitions (also referred to herein as "logical volumes") within the storage device 618. In some embodiments, the storage device 618 can include flash memory, semiconductor (solid state) memory or the like. Still further, the computing device 600 can include Read-Only Memory (ROM) 620 and Random Access Memory (RAM) 622. The ROM 620 can store programs, code, instructions, utilities or processes to be executed in a non-volatile manner. The RAM 622 can provide volatile data storage, and store instructions related to components of the storage management module that are configured to carry out the various techniques described herein. The computing device 600 can further include data bus 624. The data bus 624 can facilitate data and signal transfer between at least the processor 602, the controller 610, the network/bus interface 614, the storage device 618, the ROM 620, and the RAM 622. The various aspects, embodiments, implementations or features of the described embodiments can be used separately or in any combination.

Various aspects of the described embodiments can be implemented to use software, hardware or a combination of hardware and software. The described embodiments can also be used in combination with computer readable code on a computer readable medium for controlling manufacturing operations or as computer readable code on a computer readable medium for controlling a manufacturing line for example. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic assembly, comprising:
    a printed circuit board (PCB) substrate (i) that includes an exterior surface having an electrical contact that is electrically coupled to an electrical trace and (ii) that is formed of electrically insulating material that electrically isolates conductive traces carried therein;
    a flex assembly that includes a housing formed of electrically insulating material and that is capable of carrying transmission lines at least one having a contact that is electrically connected thereto;
    a first electromagnetic interface (EMI) shield arranged to cover an electrical component and that includes an EMI shield wall that defines, in part, a first EMI shield volume and that is electrically coupled to an electrical ground, wherein: (i) a first portion of the flex assembly is routed along the exterior surface and within the first EMI shield volume and (ii) a second portion of the flex assembly is routed along the exterior surface to the first EMI shield volume and through the EMI shield wall; and
    a second electromagnetic interface (EMI) shield arranged to cover an additional electrical component and that includes a first EMI shield wall that defines, in part, a second EMI shield volume and that is electrically coupled to the electrical ground, and wherein the second portion of the flex assembly: (i) enters the second EMI shield volume through the first EMI shield wall, (ii) is routed along the exterior surface and (iii) exits the second EMI shield volume through a second EMI shield wall.

2. The electronic assembly as recited in claim 1, the flex assembly further comprising a terminal having contacts arranged in a low-noise pattern and that includes:
    a first contact electrically connected to a first transmission line of the flex assembly, the first contact electrically coupled to a signal line, and
    a second contact electrically connected to a second transmission line of the flex assembly, the second contact electrically coupled to the electrical ground.

3. The electronic assembly as recited in claim 1, wherein the PCB substrate comprises a primary portion and a secondary portion, the secondary portion being displaced from the primary portion.

4. The electronic assembly as recited in claim 3, wherein the primary portion of the PCB substrate comprises the electrical component and the flex assembly.

5. The electronic assembly as recited in claim 4, wherein the secondary portion of the PCB substrate comprises a second electrical component and the second flex assembly.

6. The electronic assembly as recited in claim 5, wherein the second flex assembly electrically couples the second electrical component to a third conductive trace carried by the PCB substrate.

7. The electronic assembly as recited in claim 6, wherein the electrical component is a processor and wherein the second electrical component is a wireless device comprising an RF antenna.

8. The electronic assembly of claim 7, wherein the first EMI shield spans a width of the PCB substrate from a first side of PCB substrate to a second side of the PCB substrate.

9. A printed circuit board architecture comprising:
    a printed circuit board (PCB) formed of an electrically insulating material and comprising conductive traces carried interlaid within the electrically insulating material, the PCB having a primary portion and a secondary portion displaced from primary portion, the primary portion comprising an electrical component configured to process signals generated by radio frequency (RF) sensitive components and the secondary portion comprising an RF sensitive electronic component configured to receive and/or transmit RF signals; and
    a flex assembly comprising an electrically insulating material surrounding multiple signal lines in a stacked arrangement, the flex assembly comprising signal contacts arranged in an interference isolating pattern at a terminal, each signal contact being electrically connected to a corresponding signal line;
    a first electromagnetic interface (EMI) shield comprising walls electrically coupled to a conductive trace at the primary portion of the PCB and corresponding to an electrical ground provided by the PCB, wherein the electrical component is positioned within the first EMI shield and at least a portion of the flex assembly is routed along an exterior of the PCB within the first EMI shield; and
    a second EMI shield comprising additional walls electrically coupled to the electrical ground, wherein at least a second portion of the flex assembly is routed along the exterior of the PCB within the second EMI shield.

10. The printed circuit board architecture of claim 9, wherein the flex assembly further comprises ground contacts for coupling to the electrical ground provided by the PCB.

11. The printed circuit board architecture of claim 10, wherein the first EMI shield spans a width of the PCB from a first side of the PCB to a second side of the PCB.

12. The printed circuit board architecture of claim 11, wherein an electrical connection between the multiple signal lines connected to the signal contacts at the terminal and electrical traces in the PCB is located under the first EMI shield.

13. The printed circuit board architecture of claim 12, further comprising:
   a second flex assembly that electrically connects the primary portion of the PCB to the secondary portion of the PCB.

14. The printed circuit board architecture of claim 13, wherein the RF sensitive electronic component is electrically coupled to the primary portion by way of the second flex assembly.

* * * * *